United States Patent
Foster

(10) Patent No.: US 7,280,262 B1
(45) Date of Patent: Oct. 9, 2007

(54) INTEGRATED DIE LEVEL ISOLATION FOR A MEMS DEVICE

(75) Inventor: Michael J Foster, Issaquah, WA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/420,073

(22) Filed: May 24, 2006

(51) Int. Cl.
  *G02F 1/03* (2006.01)
  *G02F 1/29* (2006.01)
(52) U.S. Cl. ........................ 359/247; 359/315
(58) Field of Classification Search ................ 257/414, 257/415, 418; 438/26; 359/247
  See application file for complete search history.

(56) References Cited

U.S. PATENT DOCUMENTS 5,837,562 A * 11/1998 Cho ............................ 438/51
6,806,557 B2 * 10/2004 Ding ........................... 257/659
6,929,974 B2 * 8/2005 Ding et al. .................. 438/106
2005/0023629 A1 * 2/2005 Dink et al. .................. 257/414

* cited by examiner

*Primary Examiner*—Jordan Schwartz
*Assistant Examiner*—James C Jones
(74) *Attorney, Agent, or Firm*—Black, Lowe, Graham

(57) ABSTRACT

A Microelectromechanical Systems (MEMS) package having a housing and a MEMS device bonded within the cavity of the housing. The MEMS device includes a MEMS sensor and a base connected to the MEMS sensor at a first surface. The base includes a first support device that is collocated with the MEMS sensor and a second support device is partially physically isolated from the first support device. An attachment device attaches the second support device to a base surface of the housing. The second support device is isolated from the first support device by one or more cavities. The second support device includes a plurality of posts located adjacent to edges of the base. The plurality of posts include four corner posts and four side posts, each of the four corner posts are separated from two of the four side posts by two of the cavities.

8 Claims, 5 Drawing Sheets

INTEGRATED DIE LEVEL ISOLATION FOR A MEMS DEVICE

BACKGROUND OF THE INVENTION

Microelectromechanical Systems (MEMS) devices are typically attached to a rigid housing structure, then the rigid housing structure is attached to some other device, such as a circuit board. Small strain forces between the rigid housing structure and the MEMS device detrimentally affect the performance of the MEMS sensor located within the MEMS device. Some of the strain forces are due to differences in co-efficients of thermal expansion between the rigid structure and the MEMS device.

Therefore, there exists a need for isolation of MEMS devices from certain packaging forces.

SUMMARY OF THE INVENTION

The present invention provides a Microelectromechanical Systems (MEMS) package. The MEMS package includes a housing having a cavity with a base surface and a MEMS device bonded within the cavity. The MEMS device includes a MEMS sensor and a base connected to the MEMS sensor at a first surface. The base includes a first support device that is collocated with the MEMS sensor and a second support device that is partially physically isolated from the first support device. An attachment device attaches the second support device to the base surface of the housing.

The second support device is isolated from the first support device by one or more cavities. The second support device includes a plurality of posts located adjacent to edges of the base. The plurality of posts includes four corner posts and four side posts, each of the four corner posts are separated from two of the four side posts by two of the cavities.

BRIEF DESCRIPTION OF THE DRAWINGS

The preferred and alternative embodiments of the present invention are described in detail below with reference to the following drawings.

DETAILED DESCRIPTION OF THE PREFERRED EMBODIMENT

Figure 1:
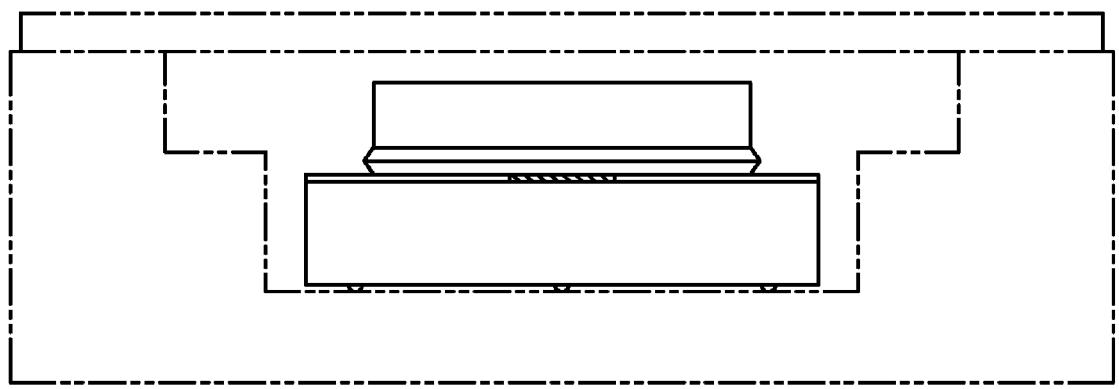
FIG. 1 illustrates a cross-sectional view of a packaged MEMS device formed in accordance with the prior art.
Figure 2A:
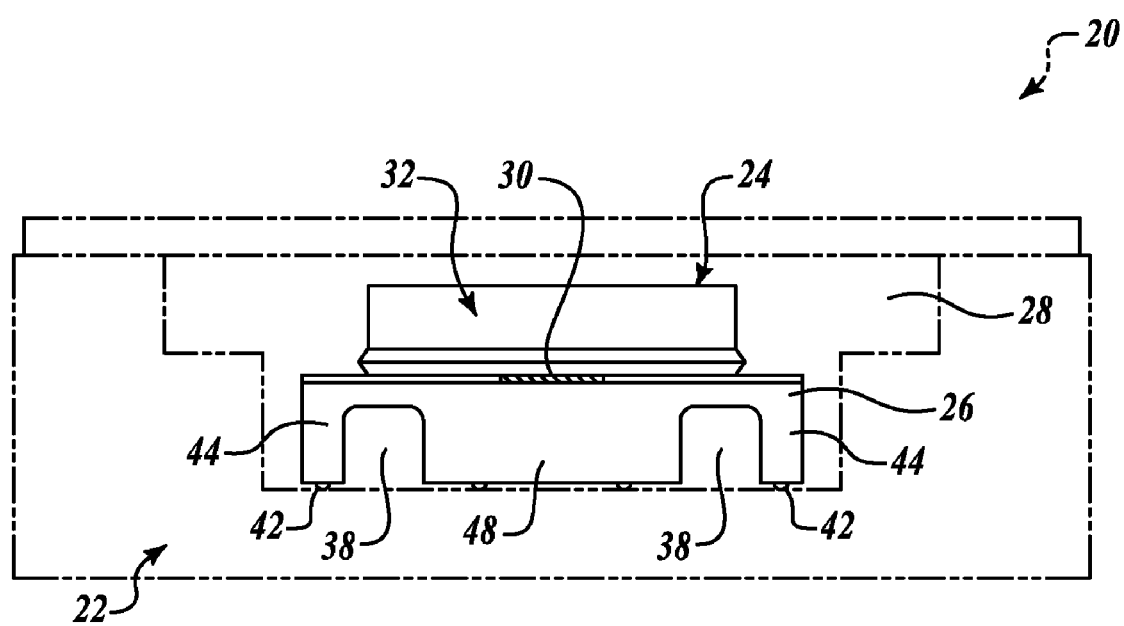
FIG. 2A illustrates a cross-sectional view of a packaged MEMS device formed in accordance with an embodiment of the present invention.
Figure 2B:
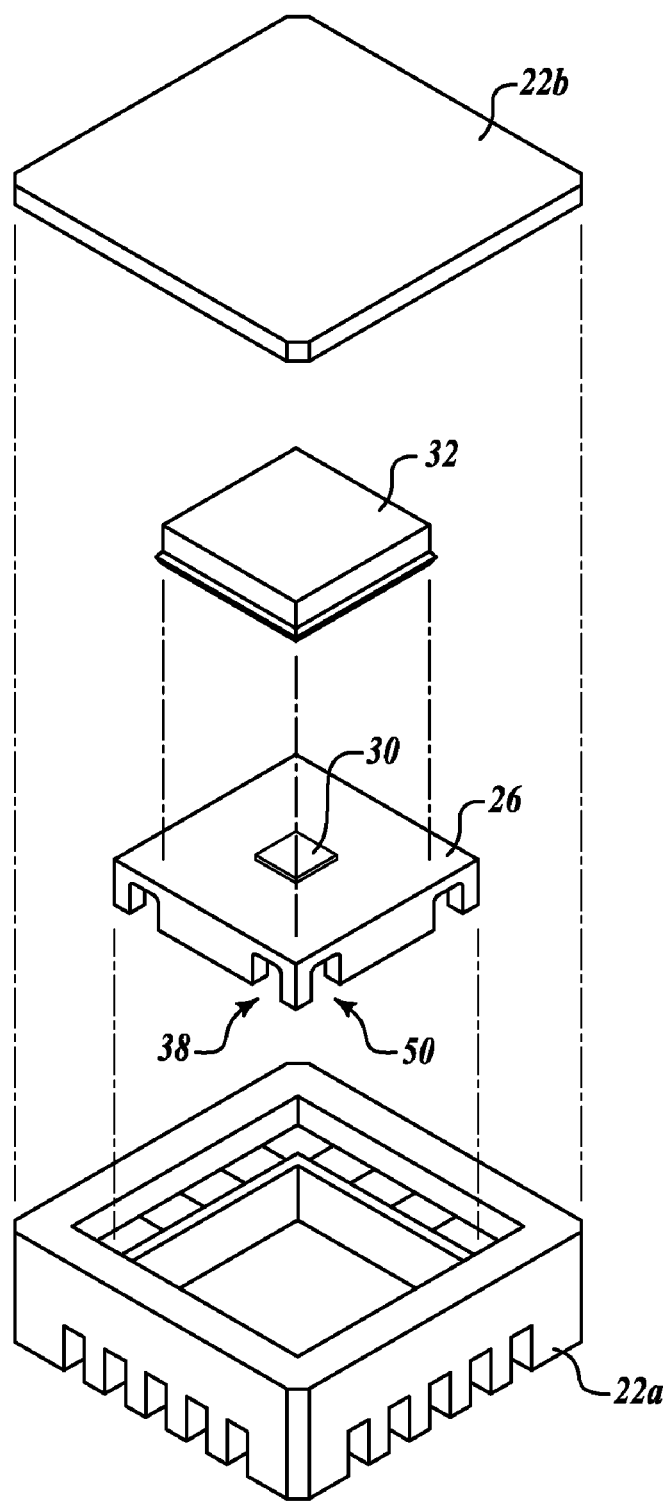
FIG. 2B illustrates a blown-up, perspective view of the packaged MEMS device shown in FIG. 2A.

As shown in FIGS. 2A and 2B, a Microelectromechanical System (MEMS) package system 20 as formed in accordance with an embodiment of the present invention is shown. The system 20 includes a MEMS device 24 that is located within a housing volume 28 formed by a housing 22 that includes a base portion 22a and a lid 22b. The MEMS device 24 includes a MEMS sensor 30 located in a sensor layer that is positioned or attached to a top surface of a substrate or base structure 26. In one embodiment, the sensor 30 is covered by a capping device 32.

Portions of the base structure 26 (cavities 38 and 50) have been removed prior to attaching the base structure 26 inside the housing 22. The cavities 38 and 50 extend from a bottom surface of the structure 26 to a pre-defined distance vertically within the structure 26. The result is four side structures 44 (two of which are shown in FIG. 2A) and a center structure 48 (FIG. 3) that are separated by the cavities 38 and 50. Each of the four side structures 44 are attached to a base surface within the housing volume 28 using attachment mechanisms 42 in order to attach the MEMS device 24 to the housing 22. Some examples of attachment mechanisms 42 include gold stud bumps, solder or epoxy.

The center structure 48 is located under the MEMS sensor 30 that is located in the sensor layer. Thus, any undesired forces between the base structure 26 and the housing 22 are only felt at the side structures 44 with the cavities 38, 50 isolating the center structure 48 and the MEMS sensor 30 from these forces.

Figure 3:
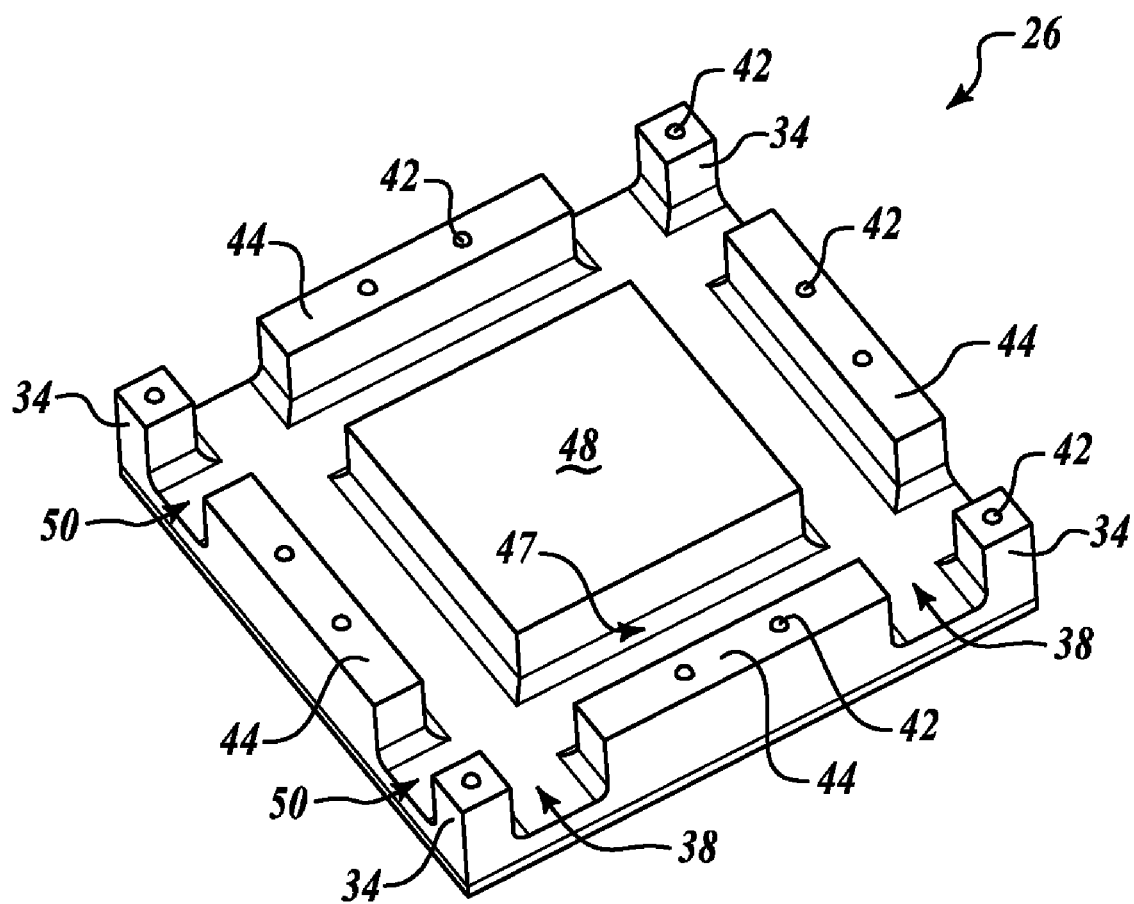
FIG. 3 illustrates an inverted perspective view of a MEMS device formed in accordance with an embodiment of the present invention.

As shown in FIG. 3, the base structure 26 is shown in perspective view and flipped upside down in order to show all the features formed in accordance with one embodiment. The base structure 26 has been etched or machined to include two sets of cavities 38 and 50 that create four corner posts 34, the four side structures 44, and the center structure 48. The base structure 26 may be made of a number of different materials, such as silicon or glass, e.g. Pyrex glass. A number of different methods can be used in order to remove material of the base structure 26 in order to form two sets of cavities 38 and 50 that isolate the center structure 48 from the corner posts 34 and the side structures 44. One example method for removal of the material of the structure 26 to form the cavities 38, 50 is by using a high precision saw. Another example method for removal of the material of the substrate 26 uses any of a number of known masking and etching techniques, such as Deep Reactive Ion Etching.

In the example of FIG. 3, the longitudinal axis of the cavities 38 are formed at 90° from the longitudinal axis of the cavities 50. The angular relationship of the longitudinal axis of the cavities 38, 50 could be formed at any angle. Also, the cavities 38, 50 may be curved instead of straight or a combination of geometric shapes.

The four corner posts 34 and the four side structures 44 are attached to the base surface in the housing volume 28 using the attachment mechanisms 42. Because the center structure 48 is co-located with the MEMS sensor 30 and is isolated from the attachment mechanisms 42, the structural deformations are limited to portions of the device 24 that are external to the center structure 48 and thus external to the MEMS sensor 30.

Figure 4:
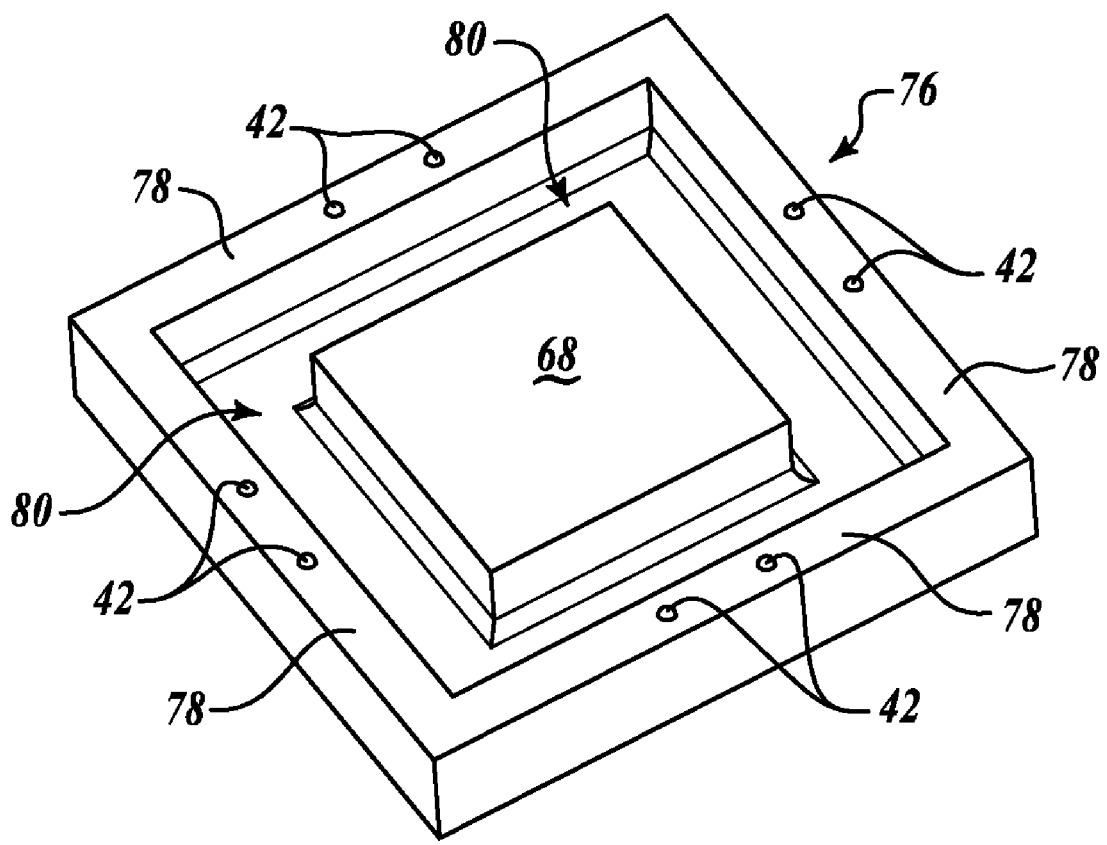
FIG. 4 illustrates an inverted perspective view of a MEMS device formed in accordance with an alternate embodiment of the present invention.

FIG. 4 illustrates a base structure 76 formed in accordance with an alternate embodiment of the present invention. The base structure 76 is etched or machined to include a cavity 80. The cavity 80 defines a center structure 68 that is surrounded on four sides by the cavity 80. The cavity 80 is formed by a circumferential wall 78 that extends around the circumference of the base structure 76. The cavity 80 is formed by silicon or glass etching techniques, precision sawing, or other silicon or glass removal techniques depending upon the material composition of the base structure 76. The circumferential wall 78 is attached at various points to the base surface of the housing volume 28 in the housing 22 (FIG. 2A) using the attachment mechanisms 42. The cavity 80 may be circular in shape or some other shape that still allows for force isolation between the circumferential wall 78 and the center structure 68.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A Microelectromechanical Systems (MEMS) device apparatus comprising:
   a housing having a cavity with a base surface;
   a MEMS device comprising:
      a MEMS sensor; and
      a base connected to the MEMS sensor at a first surface of the base, the base comprising:
         a first support device being collocated with the MEMS sensor; and
         a second support device being partially physically isolated from the first support device and non-integral with said first support device; and
   an attachment device for attaching the second support device to the base surface of the housing,
   wherein the first and second support devices share a common second surface,
   wherein one or more cavities are present between the second support device and the first support device.

2. The apparatus of claim 1, wherein the one or more cavities extend a predefined depth from a second surface of the base, the second surface being opposite the first surface.

3. The apparatus of claim 1, wherein the base includes Silicon.

4. The apparatus of claim 1, wherein the base includes glass.

5. The apparatus of claim 1, wherein the second support device includes a plurality of posts located adjacent to edges of the base.

6. The apparatus of claim 5, wherein the attachment device includes a plurality of bonds.

7. The apparatus of claim 5, wherein the plurality of posts includes four corner posts and four side posts, each of the four corner posts being separated from two of the four side posts by two of the cavities.

8. The apparatus of claim 7, wherein the four corner posts are approximately cube-shaped and four side posts are approximately rectangular-shaped.

* * * * *